United States Patent [19]
Schatter et al.

[11] 3,906,372
[45] Sept. 16, 1975

[54] CIRCUIT ARRANGEMENT FOR AUTOMATIC FREQUENCY FINE TUNING IN RADIO AND TELEVISION RECEIVERS

[75] Inventors: Eckart Schatter; Hans Kriedt, both of Munich, Germany

[73] Assignee: Siemens Aktiengesellschaft, Berlin & Munich, Germany

[22] Filed: Mar. 20, 1974

[21] Appl. No.: 453,057

[30] Foreign Application Priority Data
Mar. 29, 1973 Germany............................ 2315798

[52] U.S. Cl................................... 325/418; 325/464
[51] Int. Cl.²............................................ H04B 1/16
[58] Field of Search.................... 325/418, 464–467, 325/471, 416–417, 422, 468–469; 330/30; 334/14–16; 178/5.8 AF

[56] References Cited
UNITED STATES PATENTS 3,743,944 7/1973 Bridgewater........................ 325/418
3,806,817 4/1974 Uchida................................ 325/418

*Primary Examiner*—Robert L. Griffin
*Assistant Examiner*—Robert Hearn
*Attorney, Agent, or Firm*—Hill, Gross, Simpson, Van Santen, Steadman, Chiara & Simpson

[57] ABSTRACT

A circuit arrangement for automatic frequency fine tuning in radio and television receivers, of transmissions of different frequencies which are individually selectable by the use of respective tuning voltages, in which the fine tuning is effected with a fine tuning voltage, and upon a predetermined change in the control voltage, comprising said tuning voltages, the fine tuning voltage is cut off for a predetermined period and then reapplied.

16 Claims, 2 Drawing Figures

CIRCUIT ARRANGEMENT FOR AUTOMATIC FREQUENCY FINE TUNING IN RADIO AND TELEVISION RECEIVERS

BACKGROUND OF THE INVENTION

The invention is directed to a circuit arrangement for the automatic frequency fine tuning of radios and/or television receivers in which the adjustment of the receiver for different transmission frequencies may be electronically effected by means of different tuning voltages, and wherein a fine tuning voltage is superimposed by means of a suitable control circuit onto a tuning voltage derived from a suitable source.

Automatic frequency fine tuning (AFC) is often provided in radio and television receivers for automatically compensating field strength fluctuations and instabilities in the receiver heterodyne oscillator. By means of such a device the receiver may be set at the transmitted frequency at which it will remain with optimum adjustment, said optimum however, being dependent upon the width of the so-called pull-in range and the holding range. If the ranges are very wide, it can, for example, result in the impossibility of adjusting the receiver to a weak transmission in the vicinity of a strong transmission because the automatic frequency fine tuning is automatically oriented to the strong transmission, and the receiver thus is fine tuned thereto.

The same thing can occur in car radio receivers and the like in which a preset transmission must be received subject to strong field strength fluctuations resulting from the motion of the vehicle and the resultant change in local reception conditions, for example, when passing under bridges and the like. In this case, it is possible that after passing through the area of weak reception and entering into an area of greater field strength the receiver will be shifted to an entirely different transmission than that prior to the entry into the weaker area, as the other transmission lies in the pull-in range of the automatic frequency fine tuning.

A solution to this problem has become known and is, for example, described in the magazine "Funkschau" 1967 Edition 2, pages 47 to 48. The particular solution consists in drastically reducing the holding and pull-in range of the electronic control of the oscillator frequency in the car receiver. By these measures it is hoped that the automatic frequency fine tuning will operate reliably even in a moving car and the unpleasant jumping back and forth between two transmissions, as a result of field strength fluctuations, will no longer take place.

This solution however involves the disadvantage that not only is the advantage of automatic frequency tuning with its pull-in and holding range greatly reduced, but it may also be impossible to tune to weak transmissions when these lie within the pull-in range of a strong transmission. Such automatic frequency fine tuning likewise remains active even in the case of normal tuning.

The present invention is therefore directed to provide the advantages of automatic frequency fine tuning without the accompanying disadvantages above referred to.

BRIEF SUMMARY OF THE INVENTION

The desired results are achieved in the present invention by cutting off the fine tuning voltage upon change in the control voltage, and reapplying the fine tuning voltage only after a predetermined period of time following the cessation of change in the tuning voltage. This is accomplished by employing an electronic switch which is operable to cut-off the fine tuning voltage, with the switch being responsive to a control circuit which is operatively actuated by predetermined changes in the control voltage formed from the tuning and fine tuning voltages. The input of the control circuit is adapted to be connected over a capacitor to the control voltage and the circuit also includes a timing or delay circuit which is operable to maintain the switch open for a predetermined length of time, after its initial opening as determined by the time constant of the timing circuit.

With a circuit arrangement in accordance of the invention, the advantages provided by automatic frequency fine tuning are fully exploited. In the event of a change in tuning caused, for example by program selection or by a manual transmission hunting, the automatic fine tuning is automatically disconnected with the timing circuit insuring that it will remain disconnected for a sufficient period and thus will not start for the duration of such period, unless, of course, it is again disconnected prior thereto. It thus is possible to roughly set the receiver for a specific transmission as well as possible to tune to weak transmissions. The automatic frequency fine tuning, upon reconnection then effects the desired fine adjustment.

BRIEF DESCRIPTION OF THE DRAWINGS

In the drawings wherein like reference characters indicate like or corresponding parts.

DETAILED DESCRIPTION OF THE INVENTION

Figure 1:
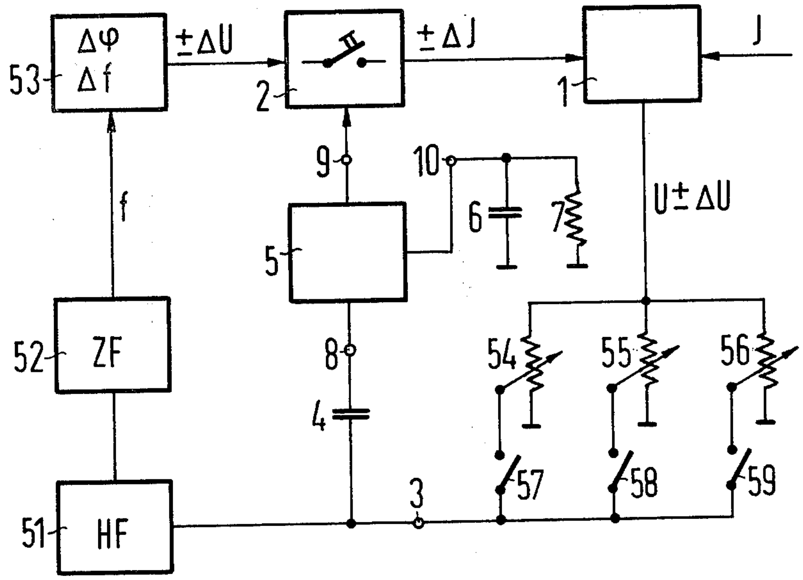
FIG. 1 is a circuit diagram, in block form, illustrating the basic features of a circuit arrangement for automatic frequency fine tuning in conjunction with automatic disconnection thereof, in accordance with the invention.

Referring to FIG. 1, the reference numeral 3 designates a terminal point forming a source of tuning control voltage for the receiver oscillator to be tuned, which is supplied to a complex 51 which represents the high frequency section of the receiver. The output of the complex 51 is connected over a complex 52, representing the intermediate frequency section of the receiver at an intermediate frequency f, to a discriminator complex 53 and with the aid of a suitable oscillator circuit, the deviation in frequency of the intermediate frequency from a theoretical value is derived and forwarded in the form of a voltage $\pm\Delta U$. There is also formed in the switch 2, which also contains a converter circuit, a current from the voltage $\pm\Delta U$ which represents the frequency deviation, which current is conducted as $\pm\Delta I$ to a mixing or combining station 1, to which is supplied a current $I$. The two currents are therein converted to a voltage $U\pm\Delta U$ which is conducted to the terminal 3 and represents the source for the tuning control voltage.

As illustrated in FIG. 1 the output of the stage 1 is conducted to the terminal 3 over a tuning network which, in the embodiment of the invention illustrated, comprises three potentiometers 54, 55 and 56, which are connected in series with respective switches 57, 58, and 59 with the respective pairs of switches and potentiometers being connected in parallel between the stage 1 and the terminal 3. Closure of a respective switch represents the adjustment of the receiver to a specific transmission frequency, while adjustment of the associated potentiometer effects a manual optimum adjustment for such a transmission. The tuning control voltage at the terminal 3, supplied to the receiver complex 51, thus represents a tuning voltage corresponding to the desired transmission frequency and also a fine tuning voltage corresponding to the frequency deviation. Consequently, in terms of control technology, a so-called control circuit is formed with the tuning path, while the fine tuning circuit represents an adjusting circuit which is operatively associated with or connected to the control circuit.

The control voltage source 3 is connected by means of a capacitor 4 to the input 8 of a control circuit 5. The output 9 of which is connected to the control input of the switch 2. The control circuit 5 is also connected over a terminal 10 to a timing circuit which, in the present case, comprises a parallelly connected capacitor 6 and resistor 7, which thus operatively connects the terminal 10 to reference potential. Changes in the control voltage will thereby pass, over the capacitor 4, to the control circuit 5 where they are so processed, irrespective of their polarity, that the output of such circuit, connected to the control input of the switch 2 is operative to open the latter. At the same time, the timing circuit is operatively connected over terminal 10 which, in dependence upon its time constant, holds the switch 2 open, over the output 9 and the control input of said switch. Thus, as long as the switch 2 remains open, the adjusting circuit for the frequency fine tuning remains open, and when the time, as determined by the fine constant of the timing circuit, has expired, the switch 2 will reclose and the automatic fine tuning will thus recommence. Changes in the tuning control voltage, which are conducted from the source 3 over the capacitor 4 into the control circuit 5, arise as a result of the operation of the switches 57 to 59, i.e., the selection of a different transmission, or as a transmission search is being carried out. It will be appreciated that the automatic disconnection of the fine tuning enables each of these processes to be carried out unaffected by the automatic fine tuning. Likewise, when the device is initially switched on, the automatic fine tuning is initially switched off and thus prevents a wrong transmission from being picked up.

Figure 2:
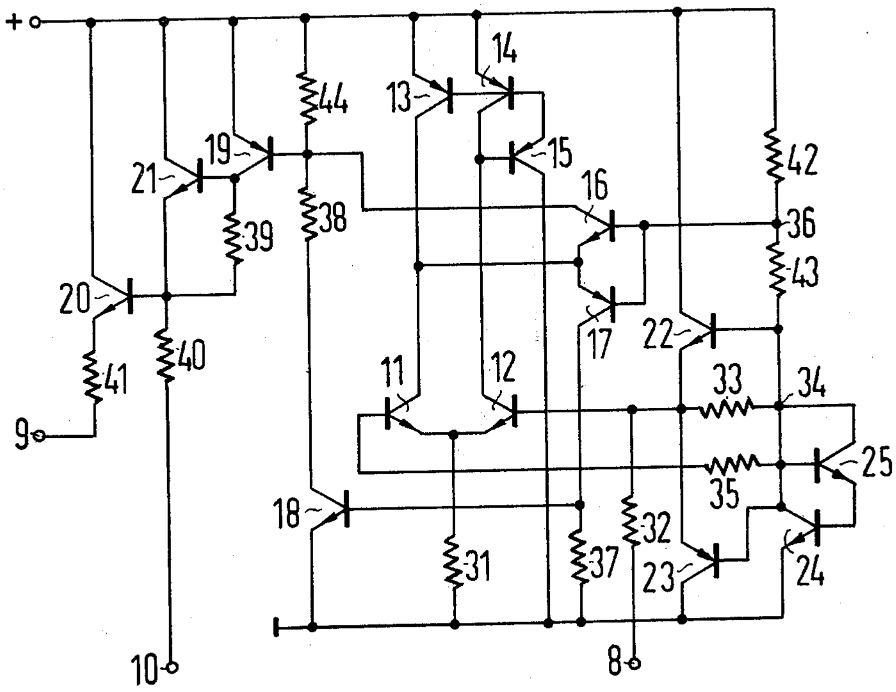
FIG. 2 is a relatively detailed circuit diagram of the control complex illustrated in FIG. 1.

FIG. 2 illustrates a specific embodiment of the control circuit 5 of FIG. 1, and likewise has an input 8, and output 9 and a terminal 10. It is also provided with a reference potential and with a supply potential, which in the example of the invention illustrated with the specific designated type of transistors employed, is a positive supply potential. If the transistors are of complementary type, the supply potential would be reversed.

Transistors 11 and 12, illustrated as being of npn-type, are circuited to form a differential amplifier, with the emitters of such transistors being connected in common, preferably over a resistor 31 to reference potential. The collector of the transistor 11 is connected over the collector-emitter path of a pnp-transistor 13, and the collector of the transistor 12 is connected over the collector-emitter path of a pnp-transistor 14 to the supply potential, while the bases of the two transistors 13 and 14 are connected in common to the emitter of a pnp-transistor 15. The base of the latter is connected to the collector of transistor 14 while its collector is connected to reference potential. Likewise, the base of transistor 12 is connected over a resistor 32 to the input terminal 8 and over a resistor 33 to a relatively low potential point 34. Such low potential point 34 is also connected to the base of transistor 11 over a resistor 35.

The collector of transistor 11 is also connected to the emitters of two transistors 16 and 17 of which the transistor 16 is of npn type and transistor 17 is of pnp type. Their bases are connected in common to an intermediate potential point 36 higher than that at point 34. The collector of the transistor 17 is connected directly to the base of a further npn-transistor 18 and over a resistor 37 to reference potential, while the collector of transistor 16 is connected to the base of a pnp-transistor 19. The base of the latter is connected over a resistor 44 to supply potential and over the collector-emitter path of the transistor 18 to reference potential. The emitter of transistor 19 is directly connected to supply potential and its collector is connected to the base of a npn-transistor 21. The emitter of the latter is connected to the base of a npn-resistor 20, and the collectors of transistors 20 and 21 are connected to supply potential. The collector of transistor 19 is connected over a resistor 39 to the base of the transistor 20 which in turn is connected over a resistor 40 to the terminal 10. The emitter of the transistor 20 is connected over a resistor 41 to the output 9.

Potential points 34 and 36 are divider points of a voltage divider extending between reference and supply potentials. The higher intermediate potential at point 36 is operatively connected to supply potential over a resistor 42 and to the potential point 34 over a resistor 43, which in turn is connected to reference potential over the collector-emitter path of a npn-transistor 24. The base of a npn-transistor 22 and that of a pnp-transistor 23 are also connected to the potential point 34. The collector of transistor 22 is connected to supply potential and that of transistor 23 to reference potential. The emitters of both transistors 22 and 23 are connected in common and are connected in common with the base of transistor 12. Likewise, the lower potential point 34 is connected to the collector and base of a npn-transistor 25 whose emitter is connected to the base of transistor 24.

The operation of the circuit thus described is as follows: Assuming a voltage surge, created by a change in the tuning voltage, appears at the input 8 of the differential amplifier formed by the transistors 11 and 12, whereby either transistor 16 becomes conductive as a result of a drop in potential across the collector of transistor 11, or else, as a result of the phase inversion stage formed by the transistors 13, 14 and 15, the transistor 17 becomes conductive with the potential rise across the collector of the transistor 11. In either case the potential across the base of the transistor 19 drops, in the first instance because the transistor is conductive, and in the second instance because the transistor 17 and transistor 18 have also become conductive. With a dropping base potential, transistor 19, and with it the two transistors 20 and 21 become conductive, as a result of which a switching current is present at the output 9, operative to open switch 2. At the same time, a current flows over the terminal 10 into the time component represented by the capacitor 6 and resistance 7, whereby the capacitor becomes charged and slowly discharges when transistors 19 and 21 are blocked. As a result of such slow discharge, the transistor 20 continues to conduct current even when the voltage surge at the input 8 has expired, and as a result of which the transistors 19 and 21 are no longer conductive. As a result, switching current will be present at the output 9, maintaining the switch 2 in open position, for the duration of a period of time as determined by the time circuit.

The transistors 19, 20 and 21 thus form a first semiconductor circuit which controls the appearance of an output signal at the output 9 of the control circuit, while the transistors 16, 17 and 18 form a second semiconductor circuit operatively connecting the first semiconductor circuit to the differential amplifer, operative to actuate such first circuit in the presence of change, of either polarity, at the input 8 of the differential amplifier. Transistors 13, 14 and 15 are in the supply circuit of the differential amplifier and thus may be grouped therewith.

Transistors 24 and 25 provide voltage stabilization and transistors 22 and 23 are operative to limit the voltage range at the input 8. In a more simple embodiment, the transistors 24 and 25 may be omitted and the collector-emitter path of transistor 24 replaced by a resistance. The voltage range limitation effected by means of transistors 22 and 23 also forms an advantageous development of the invention, while the provisions of transistor 21 and resistor 39 likewise forms an advantageous embodiment of a simpler version in which the collector of the transistor 19 is directly connected to the base of the transistor 20.

The invention is not restricted to the illustrative embodiment. The specific details of the control circuit 5, described with reference to FIG. 2, represents an advantageous development of the inventive concept but permits flexibility in design with respect to such circuit as well as the other components required for the practice of the invention.

Having thus described our invention it will be obvious that although various minor modifications might be suggested by those versed in the art, it should be understood that we wish to embody within the scope of the patent granted hereon all such modifications as reasonably and properly come within the scope of our contribution to the art.

We claim as our invention:

1. In a circuit arrangement for automatic frequency fine tuning, in radio and television receivers, of transmissions of different frequencies which are individually selectable by the use of respective tuning voltages, comprising a voltage supply circuit operable to selectively provide respective tuning voltages to the tunable transmission-selecting circuit of such a receiver, a voltage supply circuit operable to provide a fine tuning voltage derived from a received transmission, means to which said fine tuning voltage is supplied, operatively disposed in the said first-mentioned supply circuit for operatively forming the respective tuning and fine tuning voltages as a single tuning control voltage for the tunable transmission-selecting circuit of the receiver, electrical switch means disposed in said fine-tuning voltage supply circuit for operatively disconnecting the latter from said tunable transmission-selecting circuit of such a receiver, semiconductor control means responsive to predetermined changes in the tuning control voltage for opening said switch means to effect such disconnection upon the occurrence of such a change, said control means having an input to which said tuning control voltage is supplied, and an output from which a control voltage is supplied to said switch means, said control means comprising a differential amplifier to which said tuning control voltage is operatively conducted, first semiconductor means having its output connected to the output of said control means, operative to control the appearance of such control voltage thereat, and second semiconductor means having its input operatively connected to said output of said differential amplifier and its output connected to the input of said first semiconductor means, operative to actuate said first semiconductor means to supply said control voltage as said output upon predetermined output conditions of said differential amplifier, resulting from a voltage change in the tuning control voltage at said input, and a timing circuit operatively connected to said control means for maintaining the latter operative and thus the switch open for a predetermined period of time following such a change in the control voltage, said timing circuit being operatively connected to said first semiconductor means, operative to render the latter operative for a predetermined period of time following deactivation of said second semiconductor means at the conclusion of such a change in the tuning control voltage.

2. A circuit arrangement according to claim 1 wherein said differential amplifier comprises two npn-transistors, the emitters of which are operatively connected in common to a reference potential, the collector of the first transistor being connected over the collector-emitter path of a third transistor of pnp type, and the collector of the second transistor being connected over the collector-emitter path of a fourth transistor of pnp type, to supply potential, with the bases of the third and fourth transistors being connected to the emitter of a fifth transistor of pnp type, the base of which is connected to the base of the fourth transistor, and whose collector is connected to reference potential, the base of the second transistor being connected over a resistor to the input and over a resistor to a potential point, lower than the supply potential, and which is connected over a resistance to reference potential, to which point is also connected the base of the first transistor over a resistor, and the collector of the first transistor being connected to the input of said second semiconductor means.

3. A circuit arrangement according to claim 2, wherein the base of said second transistor is connected to the emitter of a sixth transistor of npn type, the base of which is connected to said lower potential point and its collector to supply potential, and a seventh transistor of pnp type, the base of which is connected to said lower potential point, its emitter to the base of said second transistor, and its collector to reference potential, said sixth and seventh transistors providing a limiting action on input voltages at the base of said second transistor.

4. A circuit arrangement according to claim 2, wherein the resistance connecting said lower potential point to reference potential comprises a first transistor of npn type, the emitter of which is connected to reference potential and the collector of which is connected to said lower potential point, the base of said first transistor being connected to the emitter of a second transistor of npn type, the base and collector of which are connected to said lower potential point.

5. A circuit arrangement according to claim 1, wherein said first semiconductor means comprises a first transistor of pnp type, the base of which forms the input of such semiconductor means, the emitter of said first transistor being connected to supply potential and the collector thereof being connected to the base of a second transistor of npn type, with the emitter being connected over a resistor to the output of said control means, and the collector of said second transistor being connected to supply potential.

6. A circuit arrangement according to claim 5, wherein the collector of said first transistor is connected to the base of said second transistor over a resistor, and a third transistor of npn type, the base of which is connected to the collector of said first transistor, the emitter of which is connected to the base of said second transistor and its collector to supply potential.

7. A circuit arrangement according to claim 6, wherein said timing means comprises a capacitor and a resistor, connected in parallel, one side of which is connected over a resistor to the base of said second transistor, and the other side to reference potential.

8. A circuit arrangement according to claim 1, wherein said second semiconductor means comprises two transistors of different types, the emitters of which are connected in common to the output of the differential amplifier, and the bases of which are connected in common to a potential point intermediate said supply potential and said lower potential, the collector of the first ransistor of npn type being connected to the input of the first semiconductor means and over a resistor to supply potential, the collector of the second transistor of pnp type being connected to reference potential over a resistor and directly to the base of a third transistor of npn type, the emitter of which is connected to reference potential and the collector of which is connected over a resistor to the input of said first semiconductor means.

9. A circuit arrangement according to claim 2, wherein said first semiconductor means comprises a first transistor of pnp type, the base of which forms the input of such semiconductor means, the emitter of said first transistor being connected to supply potential and the collector thereof being connected to the base of a second transistor of npn type, with the emitter being connected over a resistor to the output of said control means, and the collector of said second transistor being connected to supply potential.

10. A circuit arrangement according to claim 9, wherein the collector of said first transistor of the first semiconductor means is connected to the base of the second transistor thereof over a resistor, and a third transistor of npn type, the base of which is connected to the collector of the first transistor of said semiconductor means, the emitter of which is connected to the base of the second transistor thereof and its collector to supply potential.

11. A circuit arrangement according to claim 6, wherein said timing means comprises a capacitor and a resistor connected in parallel, one side of which is connected over a resistor to the base of the second transistor of said first semiconductor means, and the other side to reference potential.

12. A circuit arrangement according to claim 10, wherein said second semiconductor means comprises two transistors of different types, the emitters of which are connected in common to the output of the differential amplifier, and the bases of which are connected in common to a potential point intermediate said supply potential and said lower potential, the collector of the first transistor of said second semiconductor means, of npn type, being connected to the input of the first semiconductor means thereof and over a resistor to supply potential, the collector of the second transistor thereof, of pnp type, being connected to reference potential over a resistor and directly to the base of a third transistor of said second semiconductor means, of npn type, the emitter of which is connected to reference potential and the collector of which is connected over a resistor to the base of the transistor of said first semiconductor means.

13. A circuit arrangement according to claim 12, wherein the base forming a part thereof of said second transistor of the differential amplifier is connected to the emitter of the sixth transistor, of the npn type, the base of which is connected to said lower potential point and its collector to supply potential, and a seventh transistor, forming a part thereof, of pnp type, the base of which is connected to said lower potential point, its emitter to the base of said second transistor of the differential amplifier, and its collector to reference potential, said sixth and seventh transistors providing a limiting action on input voltages at the base of said second transistor.

14. A circuit arrangement according to claim 13, wherein the resistance connecting said lower potential point to reference potential comprises a first further transistor of npn type, the emitter of which is connected to reference potential and the collector of which is connected to said lower potential point, the base of said first further transistor being connected to the emitter of a second further transistor of npn type, the base and collector of which are connected to said lower potential point, thereby providing potential stabilization thereat.

15. A circuit arrangement according to claim 14, wherein said intermediate potential point is connected to said supply potential and to the lower potential point by respective resistors which with said first further transistor form a voltage divider between supply and reference potentials.

16. A circuit arrangement according to claim 15, wherein said timing means comprises a capacitor and a resistor, connected in parallel, one side of which is connected over a resistor to the base of the second transistor of said first semiconductor means, and the other side to reference potential.

* * * * *